(12) United States Patent
Suzuki

(10) Patent No.: US 12,402,491 B2
(45) Date of Patent: Aug. 26, 2025

(54) LIGHT-EMITTING DEVICE, DISPLAY DEVICE, IMAGING DEVICE, AND ELECTRONIC DEVICE

(71) Applicant: CANON KABUSHIKI KAISHA, Tokyo (JP)

(72) Inventor: Kentaro Suzuki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 544 days.

(21) Appl. No.: 17/707,033

(22) Filed: Mar. 29, 2022

(65) Prior Publication Data
US 2022/0320469 A1    Oct. 6, 2022

(30) Foreign Application Priority Data
Mar. 29, 2021    (JP) .................................. 2021-055266

(51) Int. Cl.
| | | |
|---|---|---|
| *H10K 59/124* | (2023.01) | |
| *H10K 50/856* | (2023.01) | |
| *H10K 59/131* | (2023.01) | |
| *H10K 59/65* | (2023.01) | |
| *H10K 59/80* | (2023.01) | |

(52) U.S. Cl.
CPC ......... *H10K 59/124* (2023.02); *H10K 50/856* (2023.02); *H10K 59/131* (2023.02); *H10K 59/65* (2023.02); *H10K 59/873* (2023.02); *H10K 59/876* (2023.02); *H10K 59/878* (2023.02)

(58) Field of Classification Search
CPC .... H10K 50/856; H10K 59/131; H10K 59/65; H10K 50/818; H10K 50/828; H10K 50/844; H10K 50/88
See application file for complete search history.

(56) References Cited

U.S. PATENT DOCUMENTS

| | | |
|---|---|---|
| 9,076,990 B2 | 7/2015 | Nakamura et al. |
| 9,490,304 B2 | 11/2016 | Nakamura et al. |
| 9,673,416 B2 | 6/2017 | Koshihara |
| 9,755,005 B2 | 9/2017 | Nakamura et al. |
| 9,991,472 B2 | 6/2018 | Koshihara |

(Continued)

FOREIGN PATENT DOCUMENTS

| | | |
|---|---|---|
| JP | 2014-89803 A | 5/2014 |
| JP | 2016-122612 A | 7/2016 |

(Continued)

*Primary Examiner* — Steven B Gauthier
*Assistant Examiner* — Adam D Weiland
(74) *Attorney, Agent, or Firm* — VENABLE LLP

(57) ABSTRACT

A light-emitting device according to the present invention includes, on a substrate, an element area in which a light-emitting element is disposed, and a terminal area in which a terminal portion electrically connected to the light-emitting element is disposed, wherein the light-emitting element has, sequentially from the substrate, a reflective layer, a first insulating layer, a first electrode, a second insulating layer, an organic layer that includes a light-emitting layer, a second electrode, and a third insulating layer, the terminal portion has a pad electrode of a material identical to that of the reflective layer, the pad electrode has an exposed portion at which a surface on a far side from the substrate is exposed, and the third insulating layer extends from the element area up to an edge of the exposed portion in the terminal area.

12 Claims, 12 Drawing Sheets

(56) References Cited

U.S. PATENT DOCUMENTS

| | | |
|---|---|---|
| 10,490,776 B2 | 11/2019 | Koshihara |
| 10,580,834 B2 * | 3/2020 | Ukigaya ............... H10K 59/124 |
| 2014/0117334 A1 * | 5/2014 | Nakamura ........... H10K 50/841 |
| | | 257/40 |
| 2015/0255517 A1 | 9/2015 | Nakamura et al. |
| 2016/0190504 A1 | 6/2016 | Koshihara |
| 2017/0012084 A1 | 1/2017 | Nakamura et al. |
| 2017/0229677 A1 | 8/2017 | Koshihara |
| 2018/0212011 A1 | 7/2018 | Lai et al. |
| 2018/0261802 A1 | 9/2018 | Koshihara |
| 2020/0212153 A1 | 7/2020 | Lai et al. |
| 2020/0227680 A1 * | 7/2020 | Akagawa ............... H10K 71/00 |
| 2022/0139970 A1 * | 5/2022 | Kim .................... H01L 27/1248 |
| | | 257/72 |
| 2022/0140021 A1 * | 5/2022 | Li ........................ H10K 59/131 |
| | | 257/40 |

FOREIGN PATENT DOCUMENTS

| | | |
|---|---|---|
| JP | 2018-29070 A | 2/2018 |
| KR | 10-2019-0039355 A | 4/2019 |
| KR | 10-2020-0026569 A | 3/2020 |
| WO | 2021/035405 A | 3/2021 |

\* cited by examiner

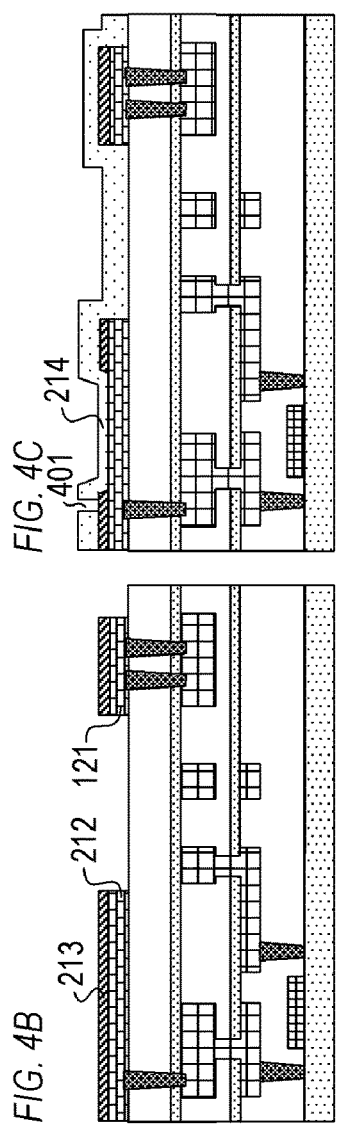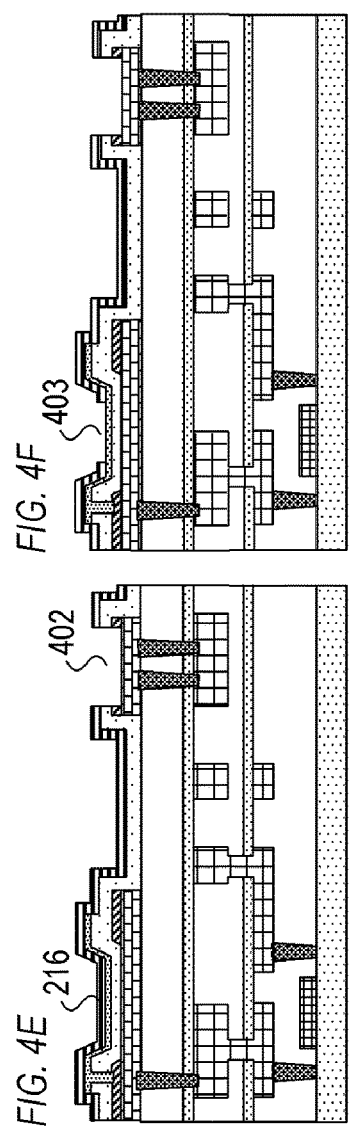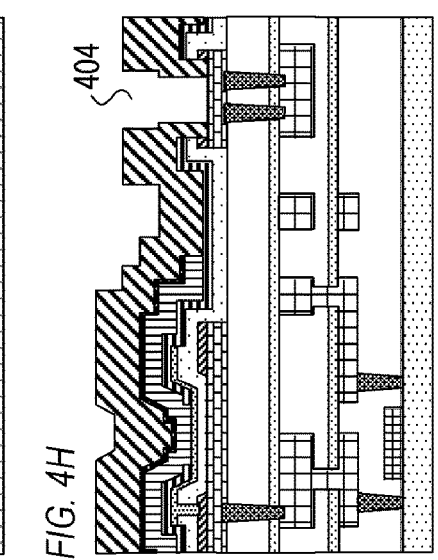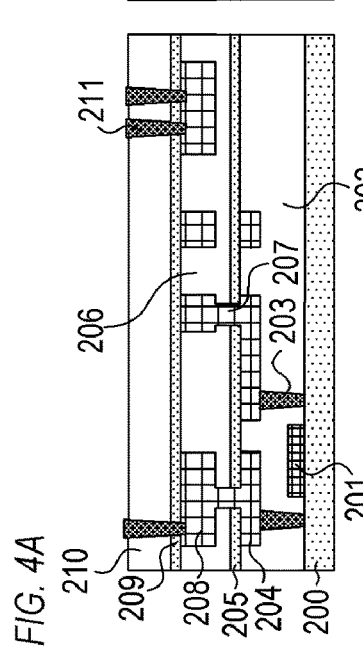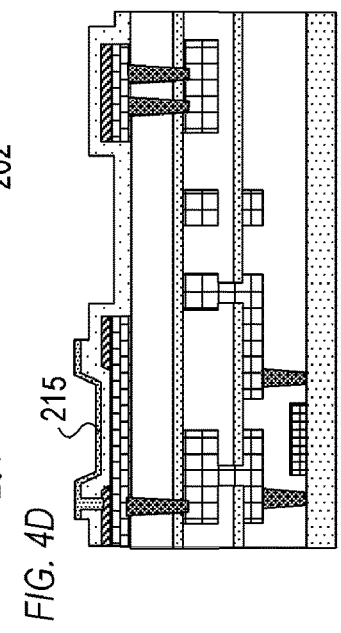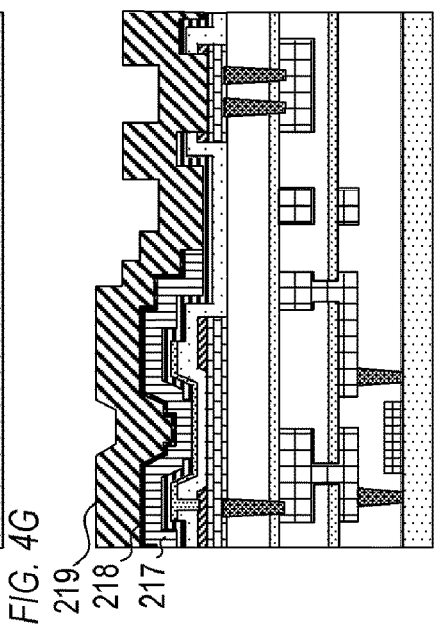

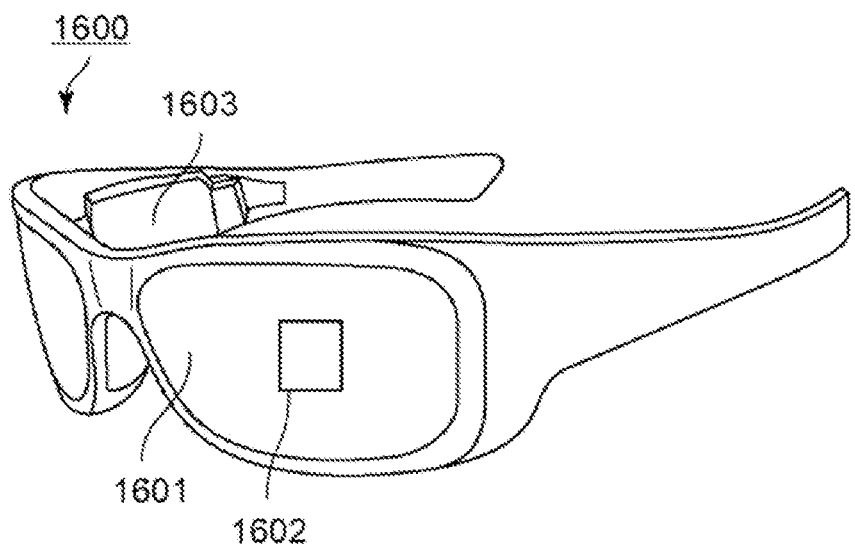
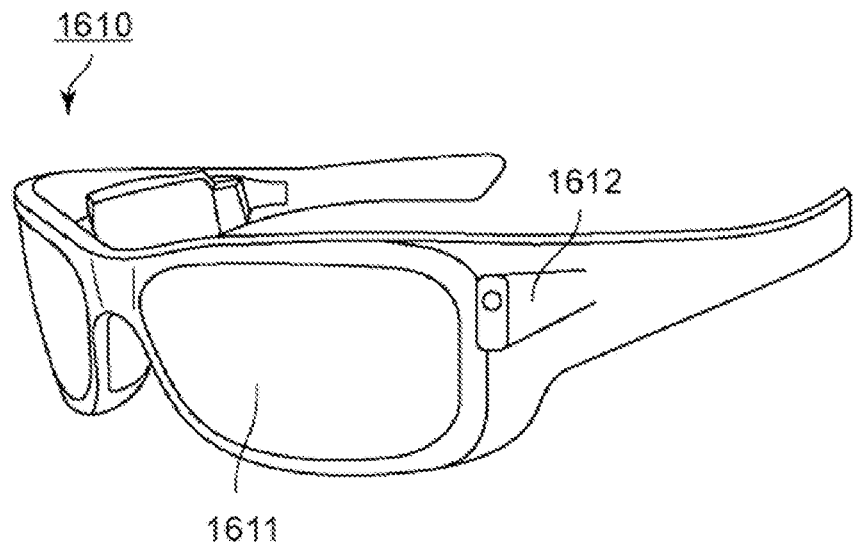

LIGHT-EMITTING DEVICE, DISPLAY DEVICE, IMAGING DEVICE, AND ELECTRONIC DEVICE

BACKGROUND OF THE INVENTION

Field of the Invention

The present invention relates to a light-emitting device, a display device, an imaging device, and an electronic device.

Description of the Related Art

Organic electronic elements that utilize organic compounds have been studied in recent years. In particular, organic light-emitting devices, also called organic electroluminescence elements or organic EL elements, are being developed at a rapid pace.

In order to implement full color in display devices it is necessary to obtain light of three primary colors, red (R), green (G) and blue (B). Methods for obtaining the three primary colors RGB in a case where an organic light-emitting element is used as a light source include a method in which respective light-emitting layers that emit red, green and blue light are applied separately, and a method in which color separation is accomplished using a white light-emitting element and RGB color filters. Light of a wide spectrum specific to the organic material is emitted in a light-emitting element that utilizes an organic light-emitting material; accordingly, it becomes difficult to obtain light of high color purity, and the color gamut (color reproduction range) of the obtained light is narrower. Therefore, methods have been conventionally proposed in which the color purity of light is improved by providing an interference structure and exploiting the microcavity effect. Japanese Patent Application Publication No. 2016-122612 (hereinafter PTL 1) discloses a display device having an interference structure in each pixel.

In PTL 1, a connection portion for external connection is configured through laying of a reflective conductive material, a contact electrode, and a transparent electrode. As is known, organic compounds of light-emitting materials used in organic EL elements generally have low moisture resistance, and dark spots and leakage current occur on account of moisture that intrudes from outside. Preferably, therefore, a sealing structure capable of suppressing the intrusion of moisture is formed on the display device. In a connection portion having a conventional configuration, however, a problem arises in the form of poorer sealing performance for instance in that the transparent electrode constitutes a moisture intrusion route.

SUMMARY OF THE INVENTION

The present invention provides a device having improved moisture resistance.

The present invention in its first aspect provides a light-emitting device including, on a substrate, an element area in which a light-emitting element is disposed, and a terminal area in which a terminal portion electrically connected to the light-emitting element is disposed, wherein the light-emitting element has, sequentially from the substrate, a reflective layer, a first insulating layer, a first electrode, a second insulating layer, an organic layer that includes a light-emitting layer, a second electrode, and a third insulating layer, the terminal portion has a pad electrode of a material identical to that of the reflective layer, the pad electrode has an exposed portion at which a surface on a far side from the substrate is exposed, and the third insulating layer extends from the element area up to an edge of the exposed portion in the terminal area.

The present invention in its second aspect provides a light-emitting device including, on a substrate, an element area in which a light-emitting element is disposed, and a terminal area in which a terminal portion electrically connected to the light-emitting element is disposed, wherein the light-emitting element has, sequentially from the substrate, a reflective layer, a first insulating layer, a first electrode, a second insulating layer, an organic layer that includes a light-emitting layer, a second electrode, and a third insulating layer, the terminal portion has a pad electrode of a material identical to that of the reflective layer, the pad electrode has an exposed portion at which a surface on a far side from the substrate is exposed, and over at least a part of the pad electrode, a total of a layer thickness of the first insulating layer and a layer thickness of the second insulating layer is smaller than a total of a layer thickness of the first insulating layer and a layer thickness of the second insulating layer over the reflective layer.

The present invention in its third aspect provides a display device including: a display part having the above mentioned light-emitting device; and a control circuit configured to control the display part. The present invention in its fourth aspect provides a photoelectric conversion device including: an optical part; an imaging element configured to receive light having passed through the optical part; and a display part configured to display an image captured by the imaging element, wherein the display part has the above mentioned light-emitting device. The present invention in its fifth aspect provides an electronic device including: a display part having the above mentioned light-emitting device; a housing in which the display part is provided; and a communication part which is provided in the housing, and which communicates with an exterior.

Further features of the present invention will become apparent from the following description of exemplary embodiments with reference to the attached drawings.

BRIEF DESCRIPTION OF THE DRAWINGS

FIG. 4A to FIG. 4H are cross-sectional diagrams illustrating a method for producing the display device according to Embodiment 1;

FIG. 12A and FIG. 12B are schematic diagrams illustrating a wearable device according to Embodiment 3.

DESCRIPTION OF THE EMBODIMENTS

Embodiment 1

Embodiment 1 of the present invention will be explained next. An example in which the present invention is applied to a display device will be explained below, but the invention can also be applied to various devices such as light-emitting devices.

Figure 1:
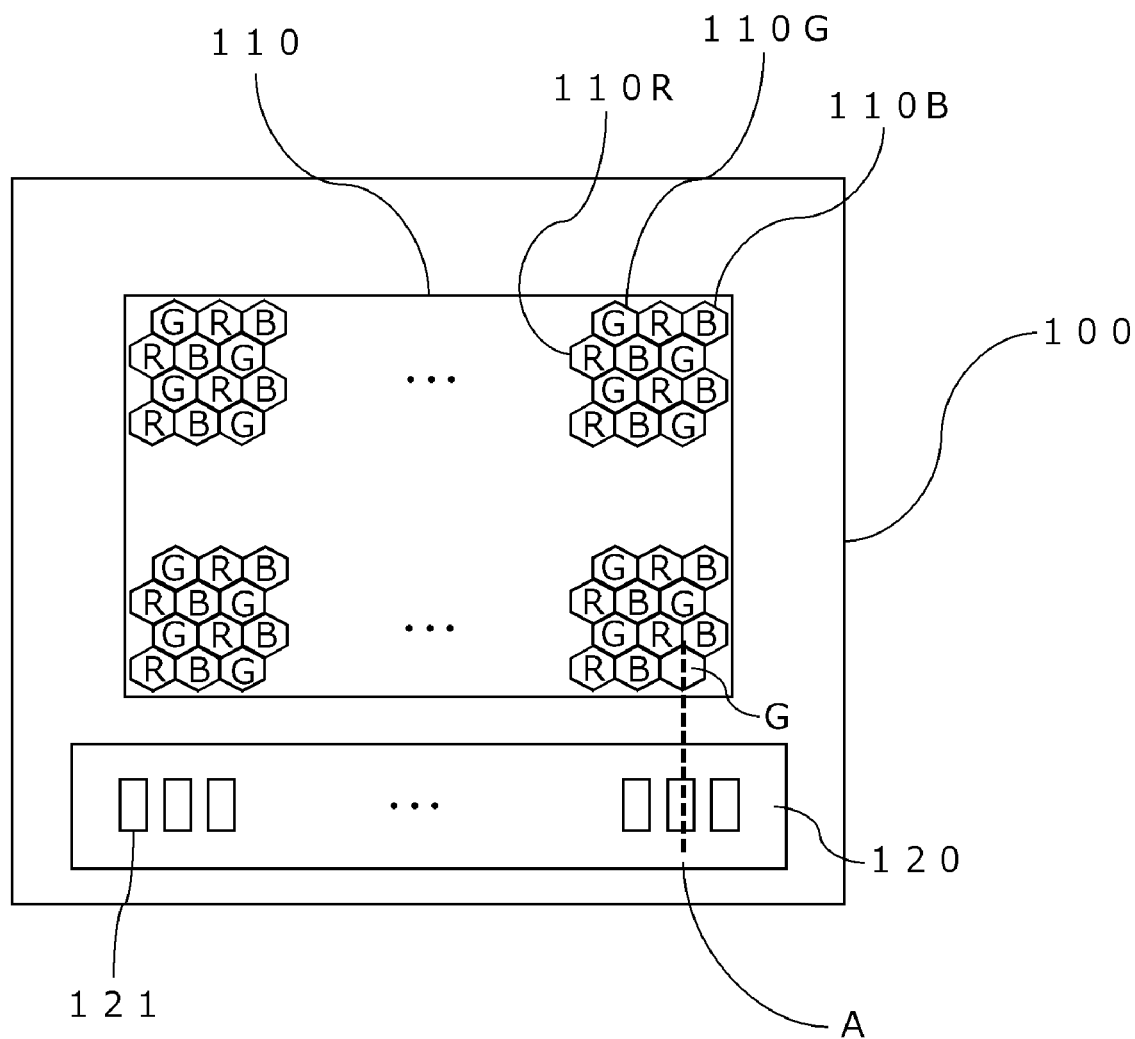
FIG. 1 is a plan-view diagram illustrating the structure of a display device according to Embodiment 1.

FIG. 1 is a plan-view diagram illustrating the structure of a display device 100 according to the present embodiment. The display device 100 has a pixel arrangement area 110 (element area) and a pad arrangement area 120 (terminal area) on a silicon substrate 200 (on a substrate). Sub-pixels 110R, 110G, 110B for display of red (R), green (G) and blue (B) are disposed in the pixel arrangement area 110, with respective light-emitting elements being disposed on the sub-pixels 110R, 110G, 110B. The arrangement of the sub-pixels can be for instance of delta type, such as that illustrated in FIG. 1, but may of mosaic type, of stripe type or of Bayer type. The pad arrangement area 120 is disposed in the periphery of the pixel arrangement area 110. It can also be said that the pad arrangement area 120 is disposed between an end portion of the display device 100 and the pixel arrangement area 110. A plurality of pad electrodes 121 is disposed in the pad arrangement area 120. The pad electrodes 121, which constitute an external terminal portion electrically connected to the light-emitting elements disposed in the sub-pixels 110R, 110G 110B, are connected to an external system for instance by way of a flexible wiring board, not shown, and can be used as signal processing paths. For instance a known chip-on-film (COF) scheme can be used as the method for connecting the pad electrodes 121 and the external system.

Figure 2:
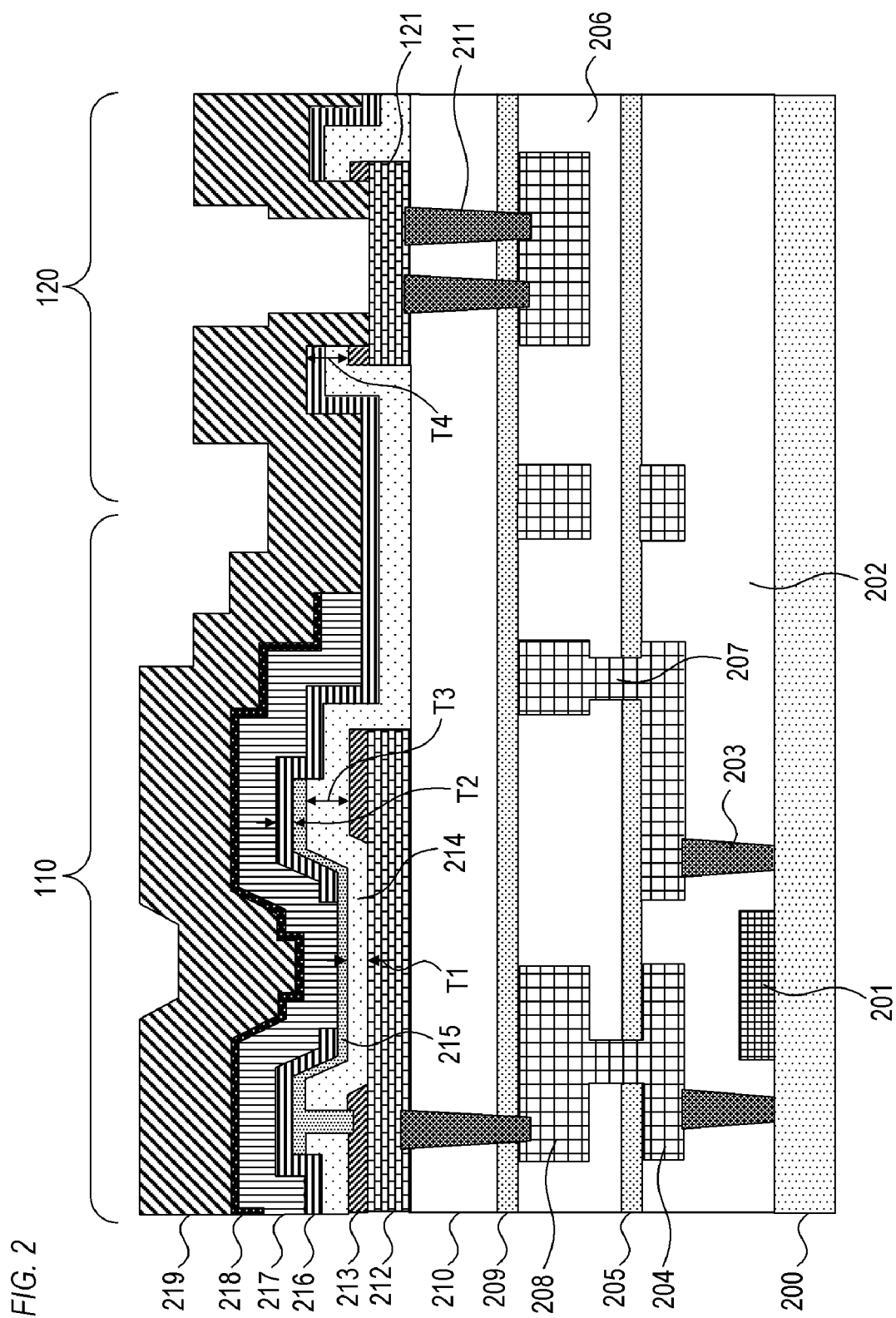
FIG. 2 is a cross-sectional diagram illustrating the structure of the display device according to Embodiment 1.

FIG. 2 illustrates a cross section obtained by cutting the display device 100 along cut line A in FIG. 1.

Each sub-pixel 110G includes a drive transistor 201, wiring layers (203 to 211), and light-emitting elements (212 to 219), on a silicon substrate 200 which is a semiconductor substrate. The sub-pixels 110R and the sub-pixels 110B have substantially the same structure as the sub-pixels 110G.

The drive transistor 201, which includes a gate electrode, and source/drain regions in the silicon substrate 200, can control driving of the light-emitting element via the wiring layers. Polysilicon or a metal silicide film can be used as the gate electrode. The drive transistor 201 may be a MOS transistor such that at least part thereof is formed inside the silicon substrate 200. Also a TFT (Thin Film Transistor) can be used as the drive transistor 201.

The wiring layers are layers that include wiring, and that can transmit a control signal from the drive transistor 201 to the light-emitting elements. In the present embodiment the wiring layers include a contact interlayer film 202, contact plugs 203, a first metal electrode 204, a first diffusion prevention film 205, a first metal interlayer insulating film 206, a first via electrode 207, a second metal electrode 208, a second diffusion prevention film 209, a second metal interlayer insulating film 210 and second via electrodes 211. A silicon oxide film, or Low-k films such as a fluorine-doped silicon oxide film, a carbon-doped silicon oxide film or the like, can be used in the contact interlayer film 202, the first metal interlayer insulating film 206 and the second metal interlayer insulating film 210. For instance tungsten can be used as the contact plugs 203 and the second via electrodes 211. For instance copper, aluminum or an aluminum alloy can be used in the first metal electrode 204, the first via electrode 207, and the second metal electrode 208. For instance a silicon nitride film, silicon carbide, or nitrogen-doped silicon carbide can be used in the first diffusion prevention film 205 and the second diffusion prevention film 209.

The structure of the wiring layers is not particularly limited, and can be freely designed taking into consideration for instance the performance and cost of the display device. For instance part of the diffusion prevention film may be omitted depending on the constituent material of the metal electrodes. Specifically, the second diffusion prevention film 209 may be omitted in a case where an aluminum-copper alloy is selected in the second metal electrode 208.

The light-emitting elements include, sequentially from the silicon substrate 200 side (substrate side), a reflective layer 212, an anti-reflective layer 213, a transparent insulating layer 214 (first insulating layer), a transparent electrode 215 (first electrode), a pixel separation insulating layer 216 (second insulating layer), an organic layer 217, an upper electrode 218 (second electrode), and a sealing layer 219 (third insulating layer). The reflective layer 212 can be formed out of a material different from that of the wiring layers (wiring), for instance out of an aluminum alloy or a silver alloy doped with neodymium, copper, silicon, palladium or the like. A barrier metal, not shown, may be present below the reflective layer 212. The anti-reflective layer 213 is disposed on at least part of the reflective layer 212. For instance titanium or titanium nitride can be used in the anti-reflective layer 213. The transparent insulating layer 214 is disposed on the reflective layer 212 and the anti-reflective layer 213. For instance a silicon oxide film, a silicon oxynitride film, a silicon nitride film or a multilayer film thereof can be used in the transparent insulating layer 214, but in the present embodiment the transparent insulating layer 214 is set to contain silicon oxide. The refractive index of the transparent insulating layer 214 is preferably from about 1.4 to 2.2.

The transparent electrode 215 is disposed on the transparent insulating layer 214 and functions as an anode. Preferably, a material exhibiting high transmittance to light of at least a visible-light wavelength is used in the transparent electrode 215. A transparent oxide conductive material such as indium tin oxide (ITO), indium zinc oxide (IZO), aluminum zinc oxide (AZO), or indium gallium zinc oxide (IGZO) is preferable as the material that makes up the transparent electrode 215. The refractive index of the transparent electrode 215 is preferably 1.7 or higher, and is particularly preferably higher than that of the transparent insulating layer 214. In other words, the refractive index of the transparent electrode 215 is preferably higher than that of the transparent insulating layer 214. Preferably, the transparent electrode 215 is connected to the reflective layer 212 via the anti-reflective layer 213. As a result it becomes possible to achieve a lower contact resistance than in a case where the transparent electrode 215 is set to be in direct contact with the reflective layer 212. The pixel separation insulating layer 216 is disposed on the transparent electrode 215, and may have a function of separating the sub-pixels and a function of defining an emission region. For instance a silicon oxide film, a silicon oxynitride film, a silicon nitride film, aluminum oxide or the like can be used as the pixel separation insulating layer 216, but in the present embodiment the pixel separation insulating layer 216 contains silicon oxide.

The organic layer 217 (organic compound layer) is disposed on the transparent electrode 215 and the pixel separation insulating layer 216, and can be formed in accordance with a vapor deposition method, a spin coating method or the like. The organic layer 217 may be made up of a plurality of layers. Examples of the plurality of layers include a hole injection layer, a hole transport layer, an electron blocking layer, a light-emitting layer, a hole blocking layer, an electron transport layer and an electron injection layer, from the side of the transparent electrode 215. The light-emitting layer emits light as a result of recombination of holes injected from the anode side and electrons injected from the cathode side. The light-emitting layer may be a single layer or a plurality of layers. A red light-emitting material, a green light-emitting material or a blue light-emitting material can be used in any of the plurality of light-emitting layers, and white light can be obtained through mixing of light from the light-emitting layers. Light-emitting materials having a complementary color relationship, such as a blue light-emitting material and a yellow light-emitting material, may be used in any of the plurality of light-emitting layers.

The upper electrode 218 is disposed on the organic layer 217 and functions as a cathode. The upper electrode 218 may be made up of a transparent oxide conductive material such as ITO or IZO, or may be made up of a metal thin film. In a case where a metal thin film is used, an Ag alloy thin film containing an alkaline-earth metal such as magnesium (Mg) or calcium (Ca) can also be used. The upper electrode 218 can be formed for instance by sputtering or vapor deposition.

The sealing layer 219 is disposed on the upper electrode 218 and may have a function of protecting the display device 100 from external moisture. As the sealing layer 219 there can be used for instance a silicon nitride film, a silicon oxynitride film, an aluminum oxide film, or a multilayer film thereof, but in the present embodiment the sealing layer 219 contains silicon nitride. The thickness of the sealing layer 219 is preferably for instance at least 10 nm and not more than 10 μm, and may differ between the pixel arrangement area 110 and the pad arrangement area 120. Although not illustrated in FIG. 2, a color filter layer, a microlens layer and/or a planarization layer may be disposed on the sealing layer 219.

An interference structure according to the present embodiment will be explained herein. The thicknesses of the transparent insulating layer 214, the transparent electrode 215 and the organic layer 217 are set so that the light-emitting elements of the sub-pixels 110R, 110G, 110B have resonance peaks at a red wavelength, a green wavelength and a blue wavelength, respectively. For instance, the sub-pixels 110R, 110G, 110B may be designed so that the optical path length from the organic layer 217 (light-emitting layer) to the reflective layer 212 is substantially suitable for red, green and blue, respectively. That is, the sub-pixels 110R, 110G, 110B can be designed to satisfy Expression 1 below. $z=(2m\pi-\varphi a)\times(\lambda/4\pi)$ . . . (Expression 1) z: optical path length from the light-emitting layer to the reflective layer 212; λ: main wavelength of light emitted from the light-emitting layer; m: interference order (integer); and φa: reflection phase, at the interface of the reflective layer 212, of light having a main wavelength λ

In a case where a highly reflective metal thin film is used as the upper electrode 218, the main wavelength of the light emitted for each sub-pixel can be intensified by adopting a design such that Expression 2 below is satisfied. $L=(2m\pi-\Phi)\times(\lambda/4\pi)$ . . . (Expression 2) L: optical path length from the reflective layer 212 to the upper electrode 218; λ: main wavelength of light emitted from the light-emitting layer; m: interference order (integer); Φ: sum of the reflection phase, at the interface of the reflective layer 212 and at the interface of the upper electrode 218, of light having a main wavelength λ

Even if the optical path length z does not satisfy Expression 1 on account of thickness deviations in the film formation step of the organic layer 217, the transparent electrode 215 and the transparent insulating layer 214, or on account of the influence of emission distribution within the light-emitting layer, the light of wavelength λ is still intensified so long as the optical path length z lies within a value range offset by ±λ/8 with respect to the value of Expression 1. Similarly, even if the optical path length L does not satisfy Expression 2, light of wavelength λ is intensified so long as the optical path length L lies within a value range offset by ±λ/8 with respect to the value of Expression 2.

The main wavelength λ can denote a wavelength region (blue region) from 420 nm to 500 nm for the sub-pixels 110B, a wavelength region (green region) from 500 nm to 560 nm for the sub-pixels 110G, and a wavelength region (red region) from 590 nm to 680 nm for the sub-pixels 110R. In a case where m=0, the respective main wavelength λ of the sub-pixels 110B, 110G can be set to a value identical or close to a value between those of the blue and green regions, since the blue region and the green region are close to each other. In this case, different blue and green emission colors can be achieved through color separation using a spectral separation member such as a color filter. The microcavity effect can be maximized when Expressions 1 and 2 are satisfied simultaneously. In FIG. 2 a design is preferably adopted in which the layer thickness T1 (film thickness) of the transparent insulating layer 214 at the portion of contact with the reflective layer 212 satisfies at least one of Expressions 1 and 2. As a result, the microcavity effect can be maximized, and the color purity of the emitted light can be increased. The layer thickness T1 of the transparent insulating layer at the portion of contact with the reflective layer 212 may be different from the layer thickness T3 of the transparent insulating layer at the portion of contact with the anti-reflective layer 213.

The structure of the pad arrangement area 120 in FIG. 1 and FIG. 2 will be explained next. Each pad electrode 121 disposed in the pad arrangement area 120 is made up of the same material as that of the reflective layer 212 disposed in the pixel arrangement area 110. In the present embodiment, as described below, the pad electrode 121 and the reflective layer 212 are formed in the same process. The pad electrode 121 can be regarded as being the same layer as the reflective layer 212. A planarized second metal interlayer insulating film 210 is disposed under the pad electrode 121 and the reflective layer 212. The pad electrode 121 and the reflective layer 212 are positioned at the same height with respect to a plane that is parallel to the top face of the silicon substrate 200. In other words, the distance between the lower face of the pad electrode 121 and the top face of the silicon substrate 200 is equal to the distance between the lower face of the reflective layer 212 and the top face of the silicon substrate 200. The pad electrode 121 may be connected to a lower wiring layer or to a transistor layer, not shown, by way of the second via electrodes 211. The transparent insulating layer 214 and the pixel separation insulating layer 216 extend from the pixel arrangement area 110 up onto the pad electrode 121 (on the pad electrode) of the pad arrangement area 120. The pad electrode 121 has an exposed portion at which the surface of the pad electrode 121 on the far side from the silicon substrate 200 is exposed, with the sealing layer 219 extending from the pixel arrangement area 110 up to the edge of the exposed portion of the pad arrangement area 120. Specifically, the sealing layer 219 surrounds the edge of the exposed portion of the pad electrode 121, and is in contact with the pad electrode 121 over the entire perimeter of the edge.

Figure 3:
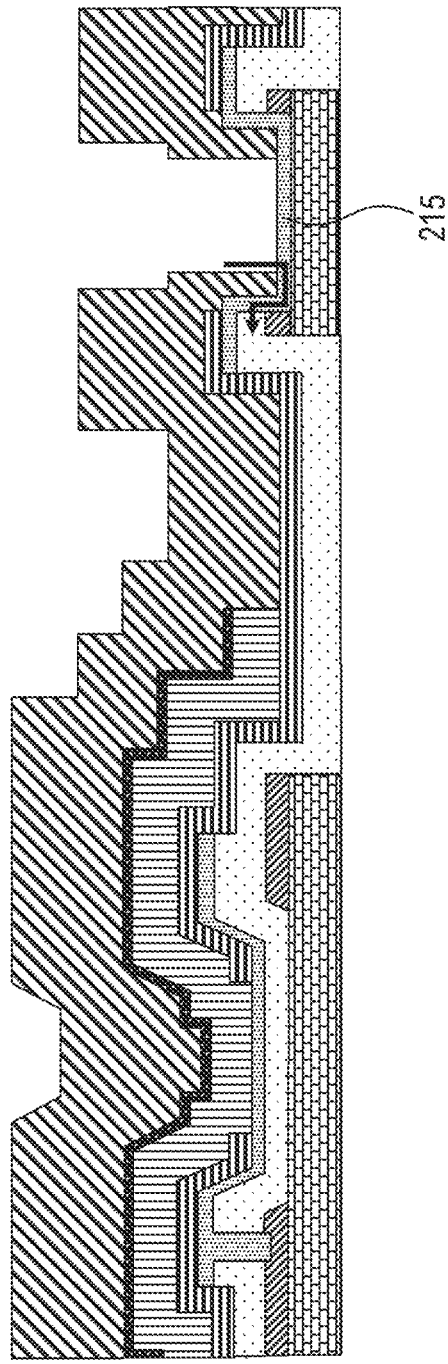
FIG. 3 is a cross-sectional diagram illustrating the structure of a conventional display device.

The effect of the present embodiment will be explained next. The structure illustrated in FIG. 3 has been proposed as a conventional structure. In the structure of FIG. 3, a stack of the reflective layer 212 and the transparent electrode 215 is used as the pad electrode 121. In this structure, the transparent electrode 215 is present between the sealing layer 219 and the reflective layer 212. The moisture permeability of the transparent electrode 215 is ordinarily higher than that of the sealing layer 219 and of the reflective layer 212. In the structure of FIG. 3, therefore, a path exists through which moisture intrudes with relatively greater ease into the display device, as indicated by the arrow.

In the present embodiment the material of the pad electrode 121 is identical to that of the reflective layer 212. That is, the transparent electrode 215 is not used in the pad electrode 121. As a result, the transparent electrode 215 is not exposed. In the present embodiment, moreover, the sealing layer 219 surrounds the edge of the exposed portion of the pad electrode 121 and is in contact with the pad electrode 121 over the entire perimeter of the edge. That is, the sealing layer 219 completely covers the end portion of the transparent insulating layer 214 and the end portion of the pixel separation insulating layer 216 on the pad electrode 121. Therefore, the transparent insulating layer 214 and the pixel separation insulating layer 216, which ordinarily have higher moisture permeability than that of the sealing layer 219 and the reflective layer 212, are not exposed. In the present embodiment only the pad electrode 121 (reflective layer 212) and the sealing layer 219 having low moisture permittivity are exposed, and accordingly there are no moisture intrusion routes, and high moisture resistance can be achieved. Higher moisture resistance can be achieved, if the sealing layer 219 extends up to the edge of the exposed portion of the pad electrode 121, even without surrounding the edge, than in a case where the sealing layer 219 does not extend up to the edge.

In FIG. 2 a design is preferably adopted in which at least over a part of the pad electrode 121 an insulating layer thickness T4 is smaller than the total of the layer thickness T2 of the pixel separation insulating layer 216 plus the layer thickness T3 of the transparent insulating layer 214 in the pixel arrangement area 110. The moisture resistance of the transparent insulating layer 214 and of the pixel separation insulating layer 216 may be lower than that of the sealing layer 219. By reducing the insulating layer thickness T4, the intrusion route of moisture slightly permeating through the sealing layer 219 into the display device 100 becomes smaller, and thus moisture resistance can be further improved. By adopting a structure in which the insulating layer thickness T4 on the end portion of the pad electrode 121 is small, it becomes possible to elicit the effect of facilitating bonding to the pad electrode 121 in chip-on-film. In consequence, the pitch of the pad electrodes 121 is made smaller, which allows eliciting the effect of increasing the number of pixels and enhancing the functionality of the display device.

In FIG. 2 a structure can be adopted in which the density of the pixel separation insulating layer 216 is higher than the density of the transparent insulating layer 214. In such a structure, the insulating layer of high density (material density) has relatively lower moisture permeability; accordingly, the intrusion route of the moisture slightly permeating through the sealing layer 219 into the display device 100 is further reduced, and thus moisture resistance can be further improved.

A method for producing the display device 100 will be explained next with reference to FIG. 4A to FIG. 4H. As illustrated in FIG. 4A, the drive transistor 201 is formed on the silicon substrate 200 through a combination of known production techniques. After formation of the contact interlayer film 202 by plasma CVD or the like, the contact plugs 203 are formed for instance by resorting to known photolithography, etching, CVD (Chemical Vapor Deposition), CMP (Chemical Mechanical Polishing) or the like. Next, the first metal electrode 204 is formed in accordance with a copper damascene method. The first diffusion prevention film 205 is formed next by plasma CVD. The rest of the wiring layers are formed similarly in accordance with known methods.

Next, as illustrated in FIG. 4B, a barrier metal, not shown, the reflective layer 212 and the anti-reflective layer 213, made of titanium, titanium nitride or the like, are formed in this order, by sputtering or the like, on the planarized second metal interlayer insulating film 210. Herein the barrier metal, the reflective layer 212 and the anti-reflective layer 213 are formed on the entire top face of the second metal interlayer insulating film 210. In other words, the barrier metal, the reflective layer 212 and the anti-reflective layer 213 are formed over the entire surface including the pixel arrangement area 110 and the pad arrangement area 120. Next, the anti-reflective layer 213, the reflective layer 212 and the barrier metal are patterned in accordance with known photolithography and etching. The pad electrode 121 is also patterned at that time. That is, the pad electrode 121 and the reflective layer 212 are formed in the same process and are patterned in the same process.

Next, part of the anti-reflective layer 213 is removed by photolithography and etching, as illustrated in FIG. 4C. For instance RIE (Reactive Ion Etching) can be used as the etching method. Fluorine, chlorine or a compound thereof can be used as the etching gas. Thereafter, the transparent insulating layer 214 is formed by plasma CVD. A high film formation temperature of the transparent insulating layer 214 may result in a lower reflectance of the reflective layer 212; therefore, the film formation temperature is preferably set to lie in a range for instance from 100° C. to 400° C. A transparent insulating layer thickness according to RGB can be obtained by repeating the patterning of the anti-reflective layer 213 and the formation of the transparent insulating layer 214 for each of the sub-pixels 110R, 110G, 110B. Next, a contact hole 401 for connecting the transparent electrode 215 and the anti-reflective layer 213 is opened by photolithography and etching.

As illustrated in FIG. 4D, the transparent electrode 215 is formed as a film by sputtering, and is patterned by photolithography and etching. The underlying transparent insulating layer 214 may also be etched at the time of etching the transparent electrode 215. In a case for instance where the layer thickness of the transparent insulating layer 214 is 200 nm, the transparent insulating layer 214 may be etched, by RIE dry etching, down to a layer thickness of at least 0 nm and not more than 150 nm.

The pixel separation insulating layer 216 is formed next, as illustrated in FIG. 4E, by plasma CVD. The density of the pixel separation insulating layer 216 can be made higher than that of the transparent insulating layer 214 by adjusting for instance the type of source gas, its flow rate, the processing temperature, and plasma power. An opening 402 of the pixel separation insulating layer 216, the transparent insulating layer 214 and the anti-reflective layer 213, on the pad electrode 121, is provided by photolithography and etching.

An opening 403 that reaches down to the transparent electrode 215 is formed next in the pixel separation insulating layer 216, as illustrated in FIG. 4F, by photolithography and etching.

As illustrated in FIG. 4G, the organic layer 217 and the upper electrode 218 are formed by vapor deposition. The sealing layer 219 is formed thereafter for instance by plasma CVD.

A pad opening 404 is formed next in the sealing layer 219 on the pad electrode 121, as illustrated in FIG. 4H, by photolithography and etching.

As a result of the above production method illustrated in FIG. 4A to FIG. 4H a structure can be obtained in which there are exposed only the pad electrode (reflective layer 212) and the sealing layer 219, having low moisture permeability, thanks to which high moisture resistance can be realized.

The production method illustrated above allows etching also the transparent insulating layer 214 on the pad electrode 121 at the time of etching of the transparent electrode 215. Therefore, the insulating layer thickness T4 on the pad electrode 121 can be made smaller than the total of the layer thickness T2 of the pixel separation insulating layer 216 plus the layer thickness T3 of the transparent insulating layer 214 in the pixel arrangement area 110. The moisture resistance of the transparent insulating layer 214 and of the pixel separation insulating layer 216 may be lower than that of the sealing layer 219. By reducing the insulating layer thickness T4, the intrusion route of moisture slightly permeating through the sealing layer 219 into the display device 100 becomes smaller, and thus moisture resistance can be further improved.

Moreover, the production method illustrated above allows making the density of the pixel separation insulating layer 216 higher than the density of the transparent insulating layer 214. As a result, the intrusion route of the moisture slightly permeating through the sealing layer 219 into the display device 100 becomes yet smaller, and moisture resistance can be further improved.

Embodiment 2

Figure 5:
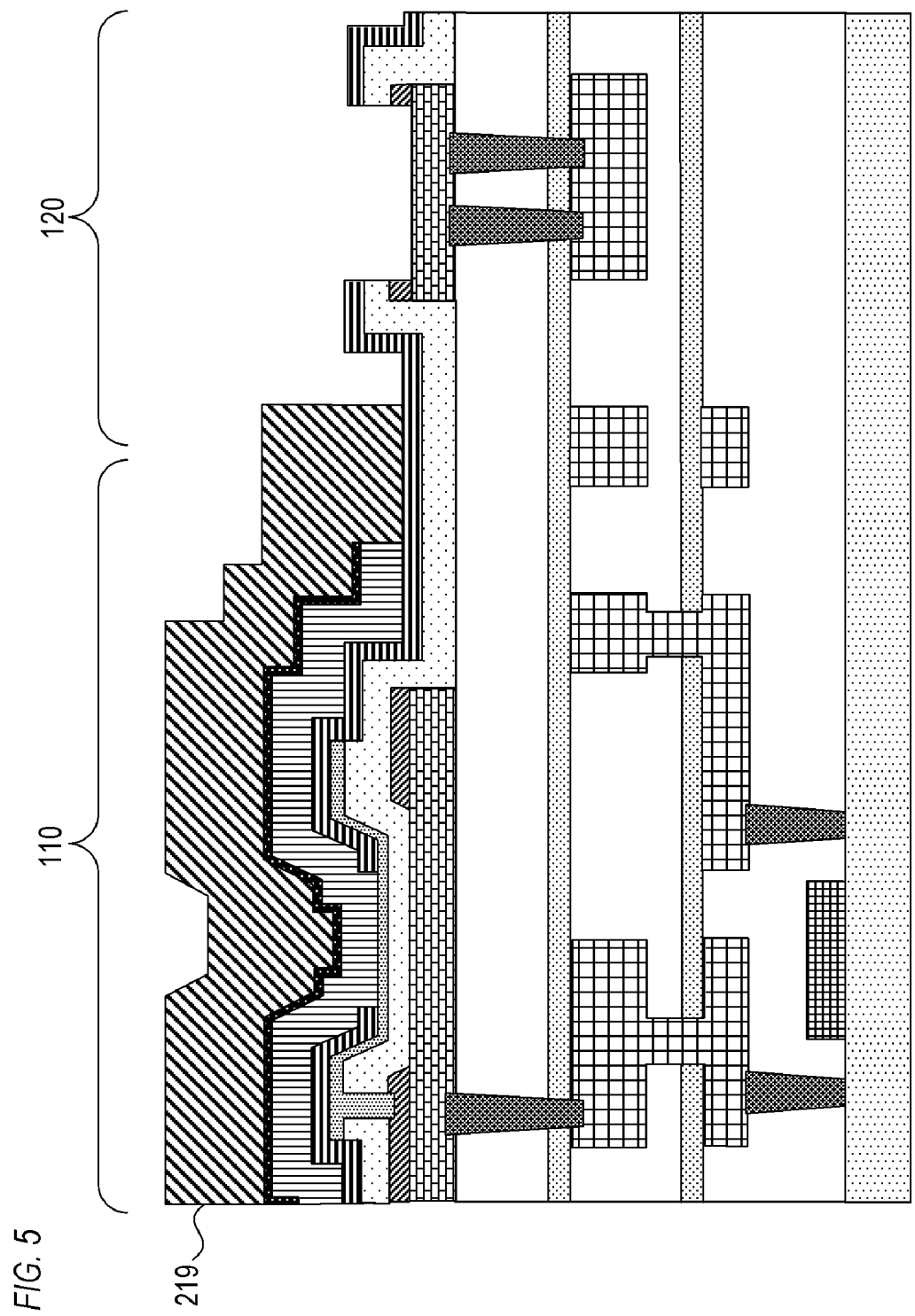
FIG. 5 is a cross-sectional diagram illustrating the structure of a display device according to Embodiment 2.

Embodiment 2 of the present invention will be explained next. An explanation of features shared with Embodiment 1 will be omitted. FIG. 5 illustrates the cross-sectional structure of a display device according to the present embodiment. In the present embodiment, as illustrated in FIG. 5, a sealing layer 219 is not provided in a portion, of the pad arrangement area 120, at which the exposed portion of the pad electrode 121 is present, nor in at least part of a portion other than the portion at which the exposed portion of the pad electrode 121 is present. In other words, the sealing layer 219 is removed, from the pad arrangement area 120, at the portion at which the exposed portion of the pad electrode 121 is formed, and in at least part of a portion other than the portion at which the exposed portion of the pad electrode 121 is formed. In the present embodiment, the insulating layer thickness at an end portion of the pad electrode 121 can be reduced through removal of the sealing layer 219. This can make bonding to the pad electrode 121 easier in chip-on-film. That is, it becomes possible to make the pitch of the pad electrodes 121 finer, and to increase the number of pixels, and/or realize higher functionality in the display device.

In the present embodiment, a design is also preferably adopted in which at least over a part of the pad electrode 121, the insulating layer thickness T4 is smaller than the total of the layer thickness T2 of the pixel separation insulating layer 216 and the layer thickness T3 of the transparent insulating layer 214 in the pixel arrangement area 110 (over the reflective layer). Further, a structure can be adopted in which the density of the pixel separation insulating layer 216 is higher than the density of the transparent insulating layer 214.

Figure 6:
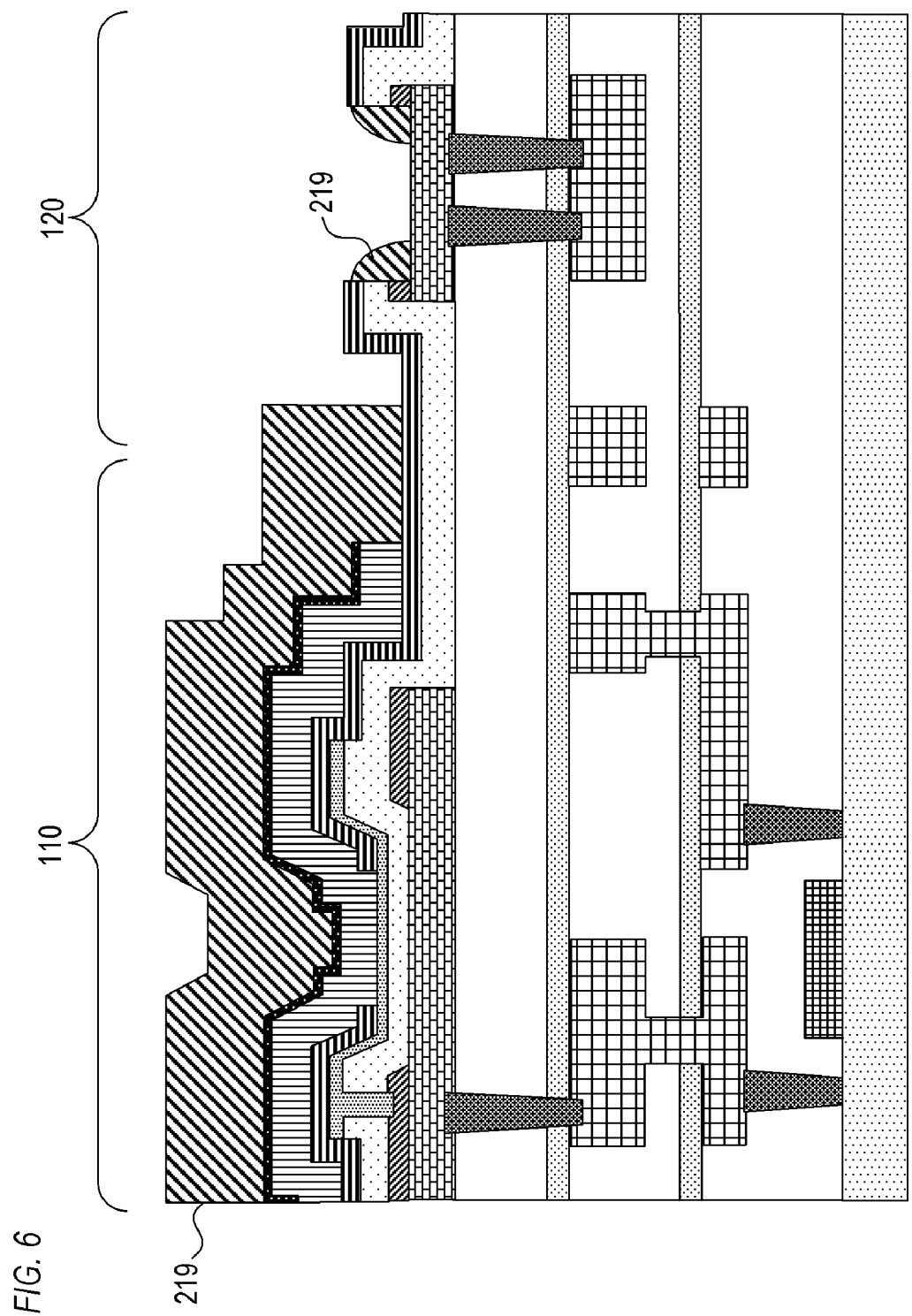
FIG. 6 is a cross-sectional diagram illustrating a variation of the structure of the display device according to Embodiment 2.

FIG. 6 illustrates a variation of the cross-sectional structure of the display device according to the present embodiment. In FIG. 6, part of the sealing layer 219 remains on the pad electrode 121, so as to cover the end portion (side wall portion) of for instance the transparent insulating layer 214 and the pixel separation insulating layer 216. In this variation, the intrusion route of moisture into the transparent insulating layer 214 can be limited by the sealing layer 219 having low moisture permeability, and a display device of yet better moisture resistance can be obtained as a result.

Figure 7A:
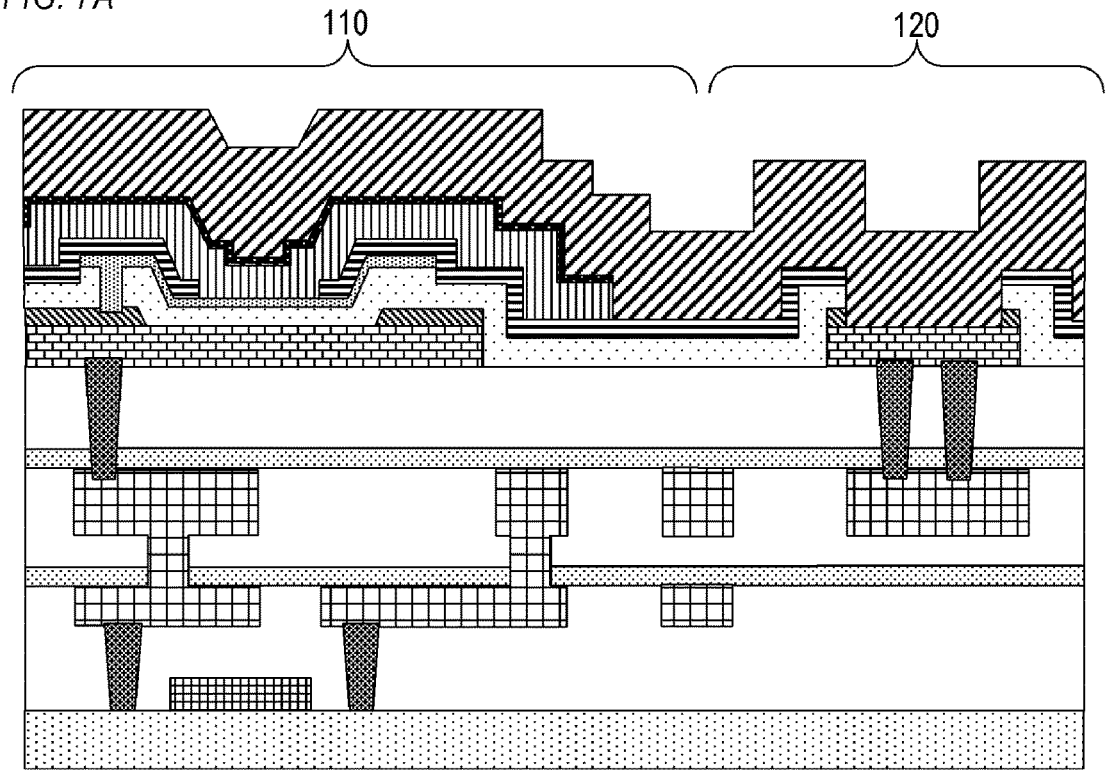
FIG. 7A and FIG. 7B are cross-sectional diagrams illustrating a method for producing the display device according to Embodiment 2.
Figure 7B:
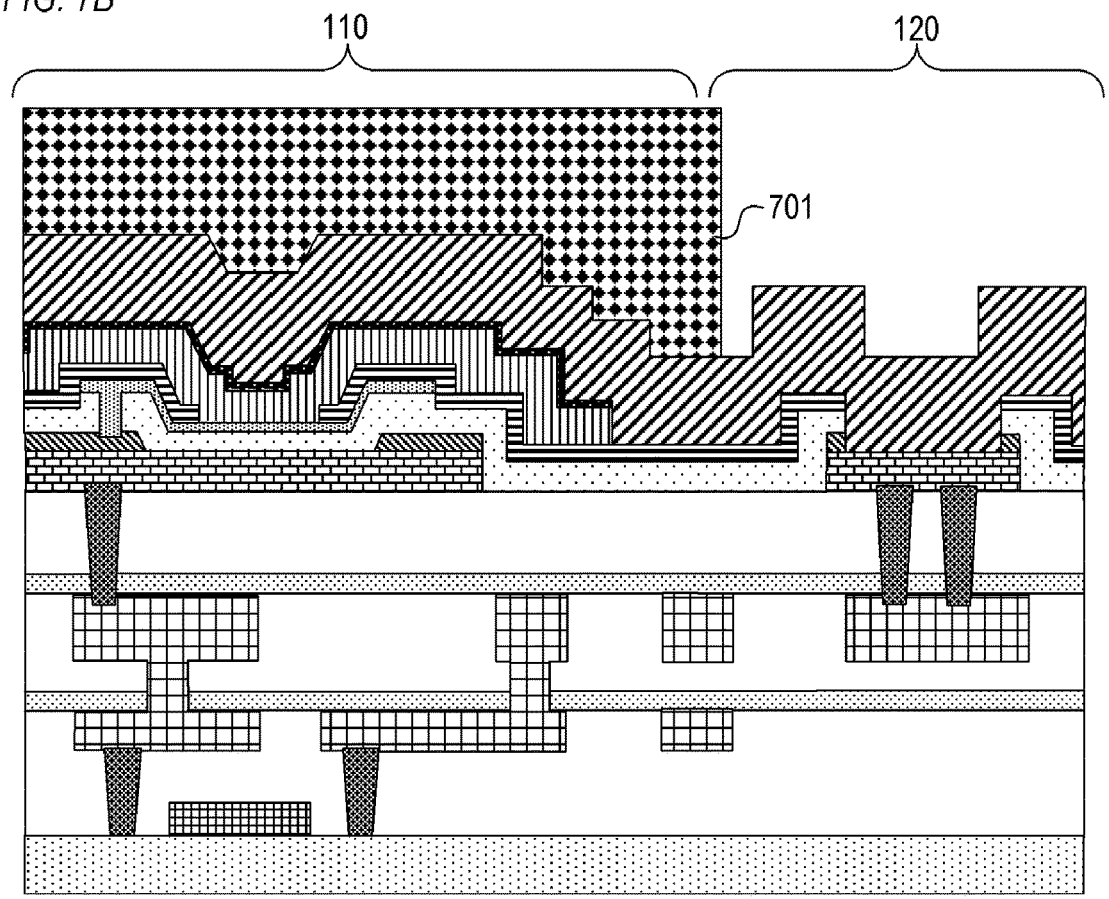

FIG. 7A and FIG. 7B illustrate a method for producing a display device according to the present embodiment. FIG. 7A illustrates a cross-sectional structure after formation of the sealing layer 219. Thereafter, as illustrated in FIG. 7B, a photoresist pattern 701 is formed in which at least part of the pad arrangement area 120 is opened. Next, the sealing layer 219 on the pad arrangement area 120 is removed in accordance with a known dry etching technique. The structure of FIG. 5 can be achieved in a convenient manner by performing dry etching so as to expose the pad electrode 121, simultaneously with removal of the sealing layer 219 on the pixel separation insulating layer 216. Part of the sealing layer 219 may be left at a side wall portion, such as that of the transparent insulating layer 214, as illustrated in FIG. 6, by adjusting as appropriate conditions such as the duration, gas flow rate and plasma power of dry etching.

Embodiment 3

Embodiment 3 of the present invention will be explained next. In the present embodiment examples will be explained in which the present invention is applied to various devices.

Figure 8:
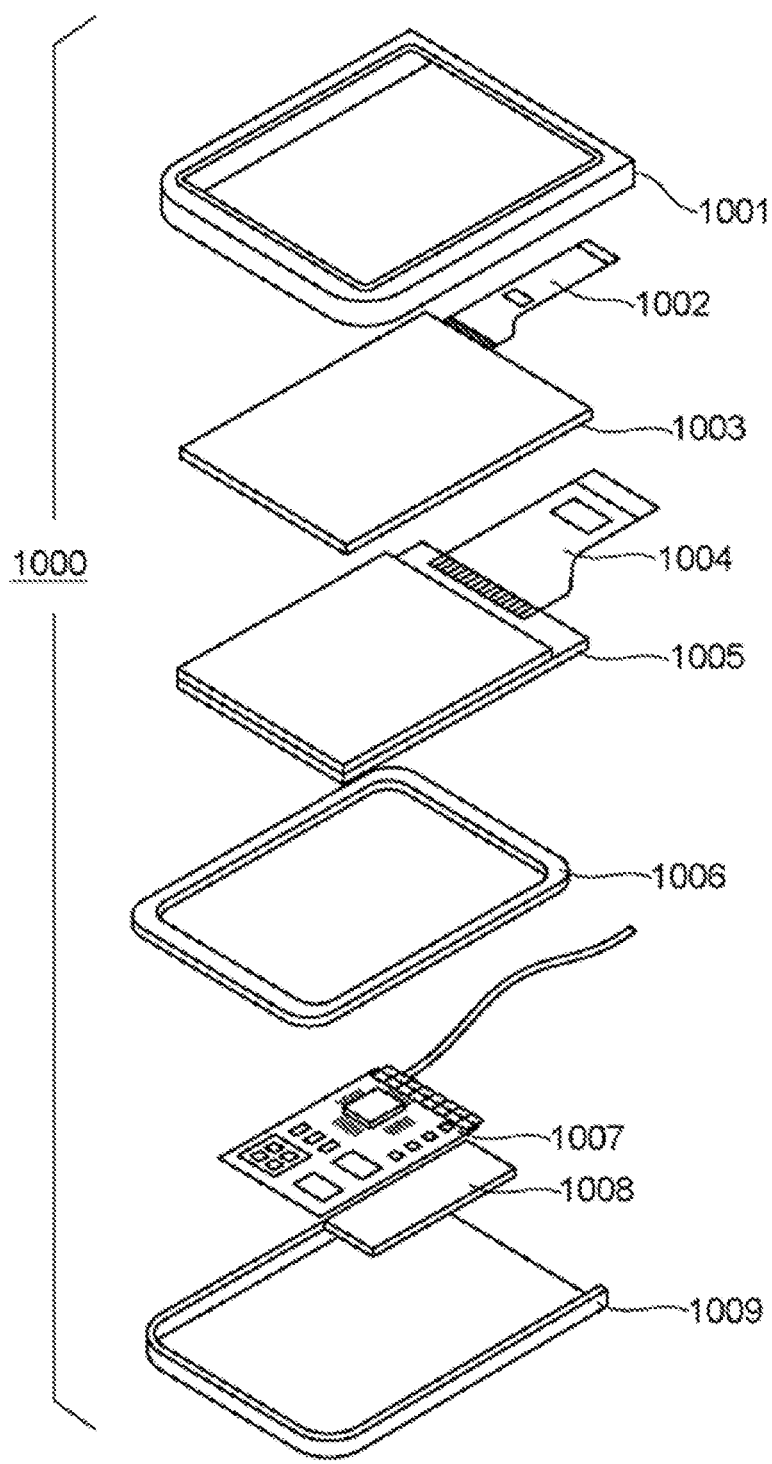
FIG. 8 is a schematic diagram illustrating a display device according to Embodiment 3.

FIG. 8 is a schematic diagram illustrating a display device 1000 being an example of a display device according to the present embodiment. The display device 1000 may have a touch panel 1003, a display panel 1005, a frame 1006, a circuit board 1007 and a battery 1008, between an upper cover 1001 and a lower cover 1009. The display panel 1005 is a display panel (display unit) to which the present invention is applied. For instance the display panel 1005 has a light-emitting device having a structure such as that illustrated in FIG. 2, FIG. 5 or FIG. 6, and displays images using the light emitted from the light-emitting device. Flexible printed circuit FPCs 1002, 1004 are connected to the touch panel 1003 and the display panel 1005. A control circuit including transistors is printed on the circuit board 1007, to perform various control tasks such as control of the display panel 1005. The battery 1008 may be omitted if the display device is not a portable device, or even if the display device is a portable device, the battery may be provided at a different position. The display device 1000 may have three types of color filters corresponding to red, green and blue, respectively. Multiple color filters may be disposed in a delta array.

The display device 1000 may be used in the display unit of a mobile terminal. In that case the display device 1000 may have both a display function and an operation function. Examples of the mobile terminal include mobile phones such as smartphones, as well as tablets and head-mounted displays.

The display device 1000 may be used in a display unit of an imaging device that has an optical unit (optical part) having a plurality of lenses, and an imaging element that receives light having passed through the optical unit. The imaging device may have a display unit that displays information acquired by the imaging element (for instance an image captured by the imaging element). The display unit may be a display unit exposed outside the imaging device, or a display unit disposed within a finder. The imaging device may be a digital camera, a digital video camera or the like.

Figure 9A:
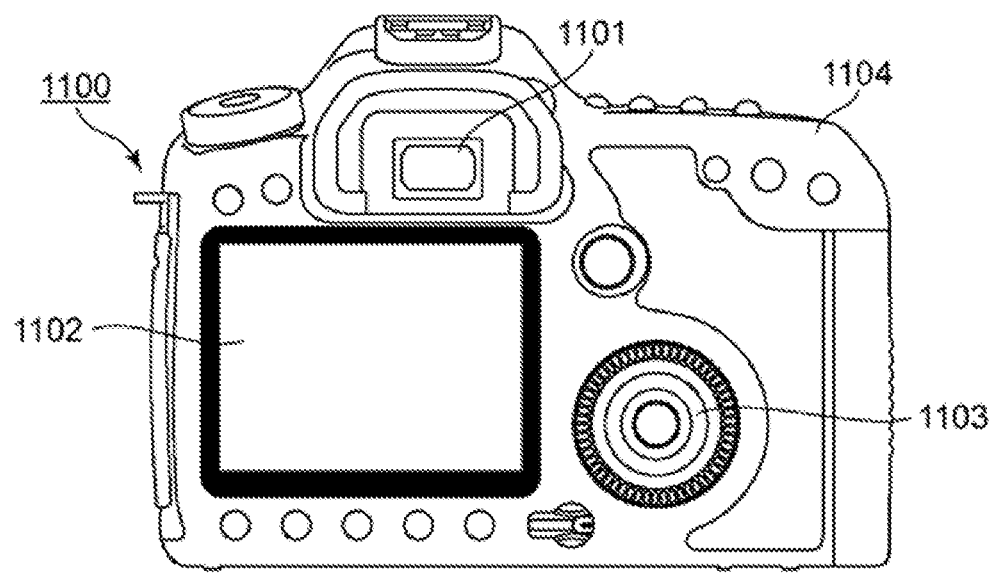
FIG. 9A and FIG. 9B are schematic diagrams illustrating an imaging device and an electronic device according to Embodiment 3.

FIG. 9A is a schematic diagram illustrating an imaging device 1100, being an example of an imaging device according to the present embodiment. The imaging device 1100 may include a viewfinder 1101, a rear display 1102, an operating unit 1103 and a housing 1104. The viewfinder 1101 may be a display unit (display device) to which the present invention is applied. In that case the viewfinder 1101 may display not only images to be captured, but also environment information, imaging instructions and so forth. The environment information may be the intensity of external light, the orientation of external light, the speed with which an object is moving or the possibility that the object is hidden by an obstruction. Also the rear display 1102 may be a display unit to which the present invention is applied.

Suitable timings are short, and thus information should be displayed as soon as possible. It is therefore preferable to use a display device that utilizes organic light-emitting elements of fast response. In devices from which display speed is required, a display device that utilizes organic light-emitting elements can be used more suitably than for instance a liquid crystal display device.

The imaging device 1100 has an optical unit not shown. The optical unit has a plurality of lenses, and forms an image, out of light, on imaging elements that are accommodated in the housing 1104. Focus can be adjusted through adjustment of the relative positions of the plurality of lenses. This operation can also be performed automatically. The imaging device 1100 may be referred to as a photoelectric conversion device. As an imaging method in the photoelectric conversion device there can be adopted for instance a method of detecting differences relative to a previous image, or a method of cutting out part of a recorded image and the like, instead of sequential imaging.

Figure 9B:
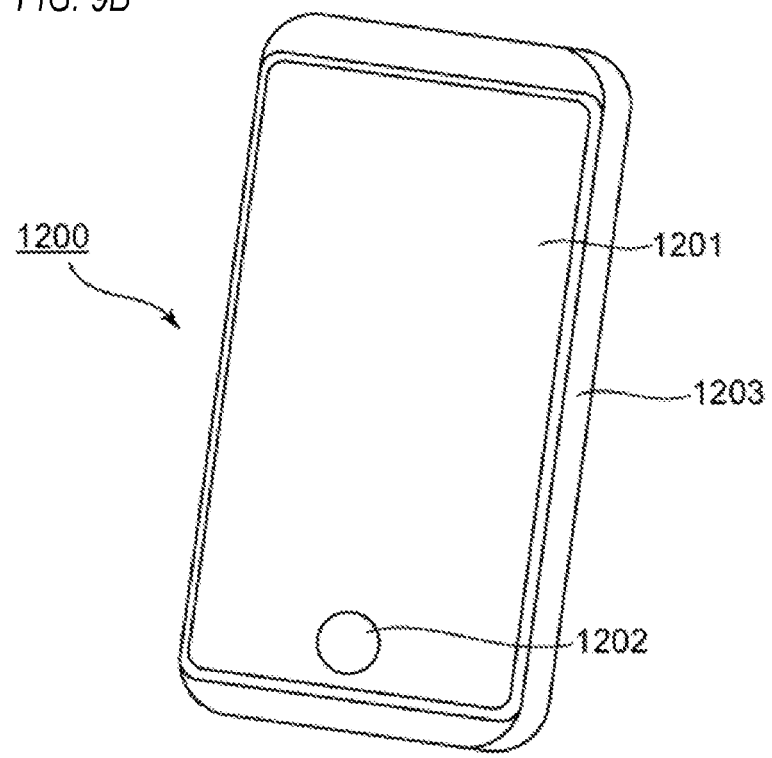

FIG. 9B is a schematic diagram illustrating an electronic device 1200, being an example of an electronic device according to the present embodiment. The electronic device 1200 has a display unit 1201, an operating unit 1202 and a housing 1203. The display unit 1201 is a display unit to which the present invention is applied. The electronic device 1200 may have a circuit, a printed board having the circuit, a battery, and a communication unit (communication part) for communicating with the exterior, in the housing 1203. The operating unit 1202 may be a button or a touch panel-type reaction unit. The operating unit may be a biometric recognition unit that for instance unlocks a lock upon recognition of a fingerprint. An electronic device having a communication unit can also be referred to as a communication device. The electronic device may further have a camera function by being provided with a lens and an imaging device. The image captured by the camera function is displayed on the display unit. Examples of the electronic device include smartphones and laptop computers.

Figure 10A:
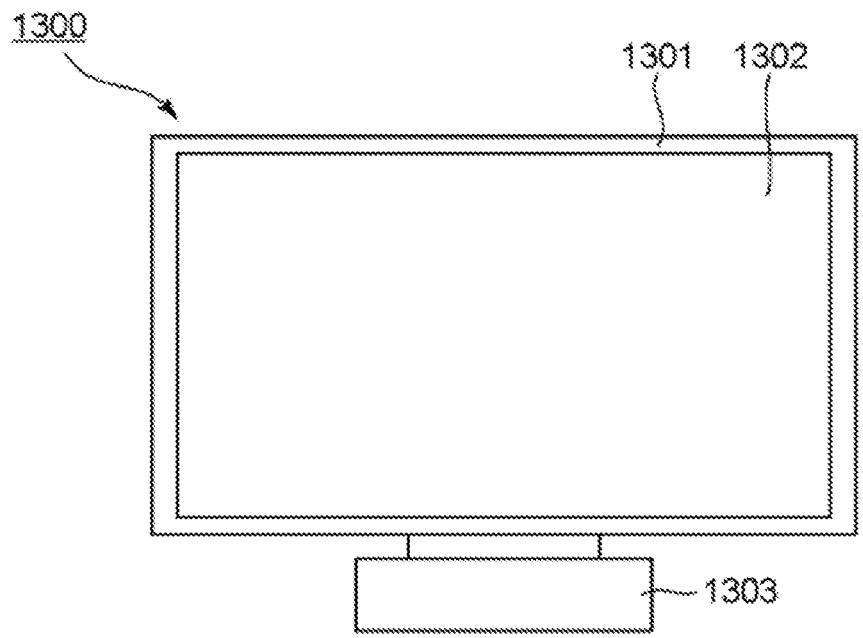
FIG. 10A and FIG. 10B are schematic diagrams illustrating a display device according to Embodiment 3.

FIG. 10A is a schematic diagram illustrating a display device 1300 being an example of the display device according to the present embodiment. The display device 1300 is a display device such as a television monitor or a PC monitor. The display device 1300 has a frame 1301, a display unit 1302 and a base 1303 that supports the frame 1301 and the display unit 1302. The display unit 1302 is a display unit to which the present invention is applied. The form of the base 1303 is not limited to the form in FIG. 10A. A lower side of the frame 1301 may double as the base 1303. The frame 1301 and the display unit 1302 may be bent. The radius of curvature may be at least 5000 mm and not more than 6000 mm.

Figure 10B:
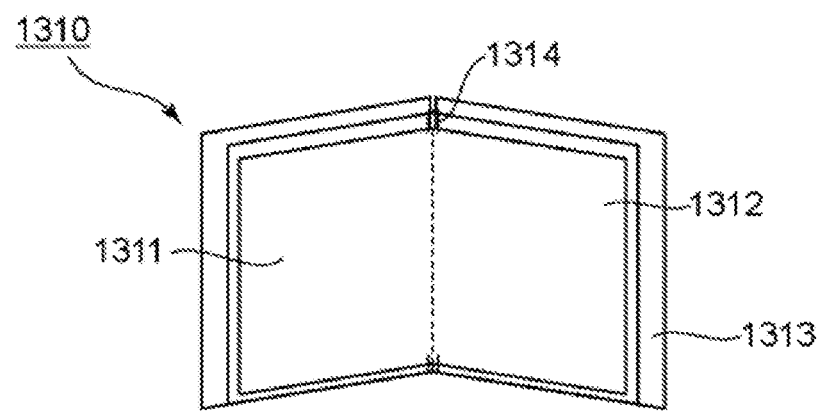

FIG. 10B is a schematic diagram illustrating a display device 1310 being an example of another display device according to the present embodiment. The display device 1310 is a so-called foldable display device configured to be foldable. The display device 1310 has a first display unit 1311, a second display unit 1312, a housing 1313 and bending points 1314. The first display unit 1311 and the second display unit 1312 are display units to which the present invention is applied. The first display unit 1311 and the second display unit 1312 may be one seamless display unit (display part). The first display unit 1311 and the second display unit 1312 can be separated at the bending points. The first display unit 1311 and the second display unit 1312 may display different images; alternatively, one image may be displayed across the first display unit 1311 and the second display unit 1312.

Figure 11A:
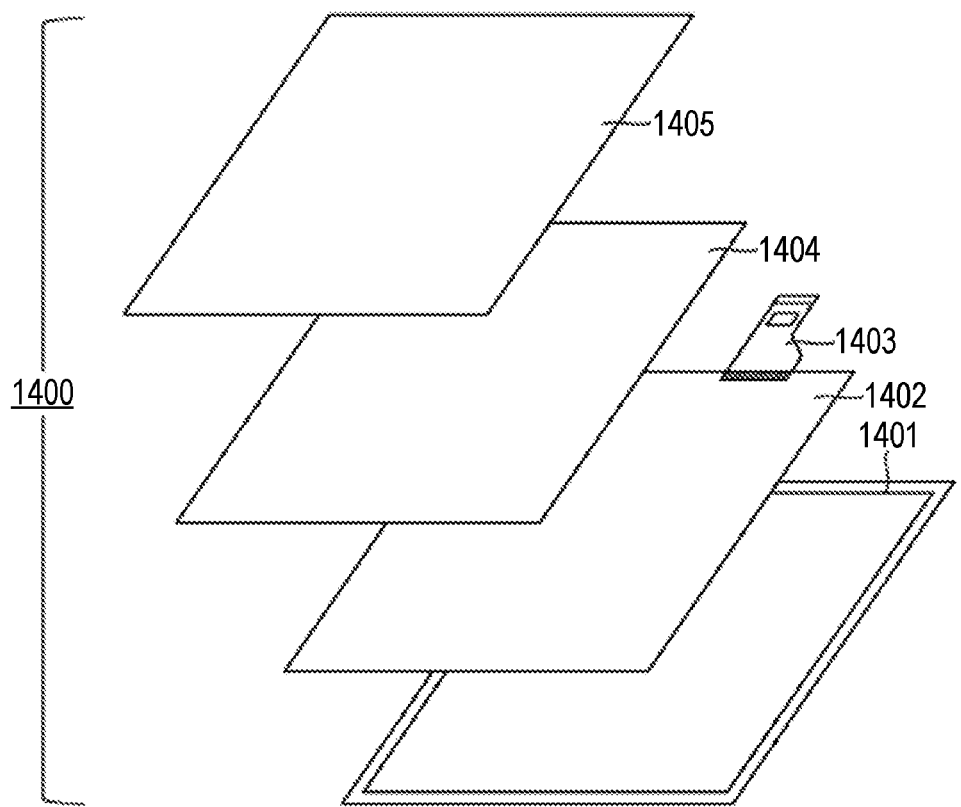
FIG. 11A and FIG. 11B are schematic diagrams illustrating a lighting device and a moving body according to Embodiment 3.

FIG. 11A is a schematic diagram illustrating a lighting device 1400 being an example of the lighting device according to the present embodiment. The lighting device 1400 may include a housing 1401, a light source 1402, a circuit board 1403, an optical film 1404 and a light diffusing unit 1405. The light source 1402 has a light-emitting device to which the present invention is applied. The optical film 1404 may be a filter (optical filter) that improves a color rendering property of the light source 1402. The light diffusing unit 1405 can effectively diffuse the light from the light source 1402, such as exterior decorative lighting, to deliver light over a wide area. The optical film 1404 and the light diffusing unit 1405 may be provided on the emission side of the lighting device 1400. A cover may be provided on the outermost portion, as needed.

The lighting device 1400 is for instance a device for indoor illumination. The lighting device 1400 may emit white, neutral white or any other color (any color from blue to red). Herein white is a color having a color temperature of 4200 K and neutral white is a color having a color temperature of 5000 K. The lighting device 1400 may have a light control circuit for controlling the emission color of the lighting device 1400. The lighting device 1400 may have a power supply circuit connected to the light source 1402. The power supply circuit is a circuit that converts AC voltage into DC voltage. The lighting device 1400 may have a color filter. The lighting device 1400 may further have a heat dissipation part. The heat dissipation part dumps heat from within the device to the exterior; examples of the heat dissipation part include metals and liquid silicone of high specific heat capacity.

Figure 11B:
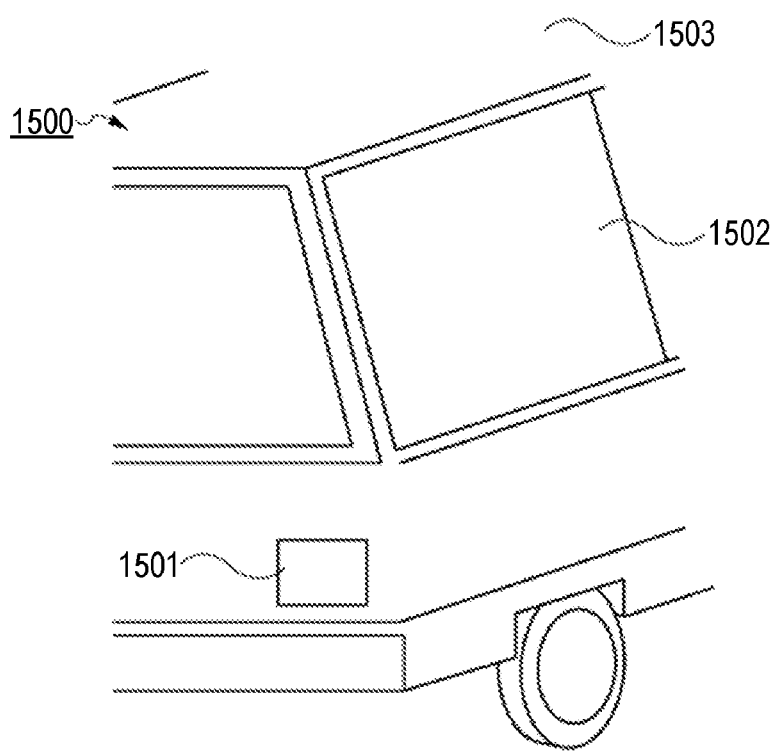

FIG. 11B is a schematic diagram illustrating an automobile 1500 being an example of a moving body according to the present embodiment. The automobile 1500 may have a tail lamp 1501 being an example of a lamp. The tail lamp 1501 lights up in response to a braking operation or the like.

The tail lamp 1501 has a light-emitting device to which the present invention is applied. The tail lamp 1501 may have a protective member that protects the light-emitting device. The protective member has high strength to some degree, and may be any material so long as it is transparent; preferably, however, the protective member is made up of polycarbonate or the like. A furandicarboxylic acid derivative, an acrylonitrile derivative or the like may be mixed with the polycarbonate.

The automobile 1500 may have a vehicle body 1503 and a window 1502 attached to the vehicle body 1503. The window 1502 may be a transparent display, so long as it is not a window for looking ahead and behind of the automobile 1500. The transparent display may have a light-emitting device to which the present invention is applied. In this case constituent materials of the light-emitting device, such as electrodes, are made up of a transparent member.

The moving body according to the present embodiment may be a ship, an aircraft, a drone or the like. The moving body may have an airframe and a lamp provided on the airframe. The lamp may emit light to indicate the position of the airframe. The lamp has a light-emitting device to which the present invention is applied.

The display device according to the present embodiment can also be applied to wearable devices such as smart glasses, HMDs and smart contact lenses. The display device according to the present embodiment can also be used in a system having a wearable device or the like. An imaging display device used as a wearable device or the like has an imaging device capable of photoelectric conversion of visible light, and a display device capable of emitting visible light.

FIG. 12A is a schematic diagram illustrating spectacles 1600 (smart glasses) being an example of a wearable device according to the present embodiment. An imaging device 1602 such as a CMOS sensor or a SPAD is provided on the surface side of a lens 1601 of the spectacles 1600. Further, a display device according to the present embodiment is provided on the back surface side of the lens 1601.

The spectacles 1600 further have a control device 1603. The control device 1603 functions as a power source for supplying power to the imaging device 1602 and the display device. Further, the control device 1603 controls the operation of the imaging device 1602 and of the display device. An optical system for condensing light onto the imaging device 1602 is formed in the lens 1601.

FIG. 12B is a schematic diagram illustrating spectacles 1610 (smart glasses) being an example of a wearable device according to the present embodiment. The spectacles 1610 have a control device 1612; herein an imaging device corresponding to the imaging device 1602 and the display device according to the present embodiment are mounted on the control device 1612. In the lens 1611 there are formed an imaging device within the control device 1612, and an optical system for projecting the light emitted from the display device, such that an image is projected onto the lens 1611. The control device 1612 functions as a power source for supplying power to the imaging device and to the display device, and controls the operation of the imaging device and of the display device.

The control device may have a line-of-sight direction unit that detects the line of sight of the wearer of the spectacles 1610. Infrared rays may be used for detecting the line of sight. An infrared emitting unit emits infrared light onto the eyeball of a user who is gazing at a displayed image. An imaging unit having a light-receiving element detects light, reflected by the eyeball, of the emitted infrared light, and a captured image of the eyeball is obtained as a result. Deterioration of the quality of the image projected onto the lens 1611 from the display device is reduced thanks to the presence of a reducing part that reduces light incident on the display unit from the infrared emitting unit, in a plan view. The line of sight of the user towards the display image is detected on the basis of the captured image of the eyeball obtained through capture using infrared light. Any known method can be utilized for detecting a line-of-sight direction using a captured image of the eyeball. As an example, a line-of-sight direction method based on a Purkinje image derived from reflection of light projected onto the cornea can be resorted to herein. More specifically, there is carried out a line-of-sight direction process based on a pupil center-corneal reflection method. The line of sight of the user is detected through calculation of a line-of-sight vector representing the orientation (rotation angle) of the eyeball, on the basis of a pupil image and a Purkinje image included in the captured image of the eyeball, in accordance with a pupil center-corneal reflection method.

In the case of display control on the basis of visual recognition detection (line-of-sight detection), the present invention can be preferably applied to smart glasses having an imaging device that captures exterior images. Smart glasses can display captured external information in real time.

The display device according to the present embodiment has an imaging device having a light-receiving element, and may control the display image on the basis of information about the line of sight of the user from the imaging device. Specifically, a first visual field area gazed upon by the user and a second visual field area other than the first visual field area are determined on the basis of line-of-sight information. The first visual field area and the second visual field area may be determined by the control device of the display device; alternatively, the display device may receive a first visual field area and a second visual field area determined by an external control device. The display resolution in the first visual field area may be controlled to be higher than the display resolution in the second visual field area, in the display area of the display device. That is, the resolution in the second visual field area may be set to be lower than that in the first visual field area.

Further, the display area may have a first display area and a second display area different from the first display area, such that either the first display area or the second display area is deemed to be a high-priority area on the basis of the line-of-sight information. The first display area and the second display area may be determined by the control device of the display device; alternatively, the display device may receive a first display area and a second display area determined by an external control device. The resolution of an area of high priority may be controlled to be higher than the resolution of an area other than the high-priority area. That is, the resolution of an area of relatively low priority may be set to be low.

Artificial intelligence (AI) may be used to determine for instance the first visual field area or a high-priority area. This AI may be a model constructed to estimate the angle of the line of sight from the eyeball image, and the distance up to a target object ahead in the line of sight, using training data in the form of the eyeball image and the direction in which the eyeball in the image is actually gazing. The AI program may be in the display device, in the imaging device, or in an external device. In a case where the external device has the AI program, the program is transmitted to the display device via communication.

As described above, display with good image quality, and good light emission, can be achieved by adopting the present invention in various devices.

The present invention allows providing a device having improved moisture resistance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-055266, filed on Mar. 29, 2021, which is hereby incorporated by reference herein in its entirety.

What is claimed is:

1. A light-emitting device comprising, on a substrate, an element area in which a light-emitting element is disposed, and a terminal area in which a terminal portion electrically connected to the light-emitting element is disposed, wherein the light-emitting element has, sequentially from the substrate, a reflective layer, a first insulating layer, a first electrode, a second insulating layer, an organic layer that includes a light-emitting layer, a second electrode, and a third insulating layer, the terminal portion has a pad electrode made up of the same material as that of the reflective layer, the pad electrode has an exposed portion at which a surface on a far side from the substrate is exposed, the third insulating layer extends from the element area up to an edge of the exposed portion in the terminal area, and the first insulating layer and the second insulating layer extend from the element area up onto the pad electrode in the terminal area.

2. The light-emitting device according to claim 1, wherein the third insulating layer surrounds an edge of the exposed portion.

3. The light-emitting device according to claim 1, wherein the third insulating layer and the pad electrode are in contact over an entire perimeter of an edge of the exposed portion.

4. The light-emitting device according to claim 1, wherein the reflective layer and the pad electrode are disposed in a same layer.

5. The light-emitting device according to claim 1, comprising a wiring layer including wiring made up of a material different from that of the reflective layer, between the substrate and the reflective layer.

6. The light-emitting device according to claim 1, wherein over at least a part of the pad electrode, a total of a layer thickness of the first insulating layer and a layer thickness of the second insulating layer is smaller than a total of a layer thickness of the first insulating layer and a layer thickness of the second insulating layer over the reflective layer.

7. The light-emitting device according to claim 1, wherein on the pad electrode, an end portion of the first insulating layer and an end portion of the second insulating layer are covered by the third insulating layer.

8. The light-emitting device according to claim 1, wherein the first insulating layer and the second insulating layer contain silicon oxide; and the third insulating layer contains silicon nitride.

9. The light-emitting device according to claim 1, wherein density of the second insulating layer is higher than density of the first insulating layer.

10. A display device comprising:

a display part having the light-emitting device according to claim 1; and a control circuit configured to control the display part.

11. A photoelectric conversion device comprising:

an optical part;

an imaging element configured to receive light having passed through the optical part; and a display part configured to display an image captured by the imaging element, wherein the display part has the light-emitting device according to claim 1.

12. An electronic device comprising:

a display part having the light-emitting device according to claim 1;

a housing in which the display part is provided; and a communication part which is provided in the housing, and which communicates with an exterior.

* * * * *